United States Patent [19]

Hong et al.

[11] Patent Number: 5,536,673
[45] Date of Patent: Jul. 16, 1996

[54] METHOD FOR MAKING DYNAMIC RANDOM ACCESS MEMORY (DRAM) CELLS HAVING LARGE CAPACITOR ELECTRODE PLATES FOR INCREASED CAPACITANCE

[75] Inventors: Gary Hong, Hsin-chu; Jason Jyh-shyang Jenq, Pingtung, both of Taiwan

[73] Assignee: United Microelectronics Corporation, Hsin-chu, Taiwan

[21] Appl. No.: 507,536

[22] Filed: Jul. 26, 1995

[51] Int. Cl.⁶ .......................................... H01L 21/8242
[52] U.S. Cl. .......................... 437/60; 437/193; 437/919
[58] Field of Search ........................ 437/47, 60, 193, 437/195, 919, 978; 148/DIG. 14

[56] References Cited

U.S. PATENT DOCUMENTS

| | | | |
|---|---|---|---|
| 4,742,018 | 5/1988 | Kimura et al. | 437/48 |
| 5,021,357 | 6/1991 | Taguchi et al. | 437/52 |
| 5,053,351 | 10/1991 | Fazan et al. | 437/52 |
| 5,270,238 | 12/1993 | Kim | 437/60 |
| 5,288,655 | 2/1994 | Higasitani et al. | 437/52 |
| 5,396,456 | 3/1995 | Liu et al. | 365/174 |
| 5,441,909 | 8/1995 | Kim | 437/60 |
| 5,449,635 | 9/1995 | Jun | 437/919 |

Primary Examiner—Chandra Chaudhari
Attorney, Agent, or Firm—William H. Wright

[57] ABSTRACT

A method is desired for making an array of dynamic random access memory (DRAM) cells having stacked capacitors with increased capacitance. The method involves forming a bottom electrode having a lower and upper fin-shaped portion in which a vertical extension is formed on the lower fin-shape portion at the same time that the upper fin is formed. This increases the capacitance of the stacked capacitor. The bottom electrode is formed by patterning a thick expendable silicon oxide layer and an underlying doped polysilicon layer (lower fin portion). Another polysilicon layer (upper fin portion is conformally coated over the thick insulating layer and patterned with an etch mask, which is smaller than the patterned insulating layer. An anisotropic etch is performed that forms the upper fin portion, the vertical extension on the lower fin portion and electrically isolates the array of electrodes. The capacitors are then completed by removing the expendable oxide layer, forming a capacitor dielectric layer on the bottom electrode, and patterning a doped polysilicon layer for the top electrode of the stacked capacitor.

22 Claims, 5 Drawing Sheets

METHOD FOR MAKING DYNAMIC RANDOM ACCESS MEMORY (DRAM) CELLS HAVING LARGE CAPACITOR ELECTRODE PLATES FOR INCREASED CAPACITANCE

BACKGROUND OF THE INVENTION (1) Field of the Invention

This invention relates to a dynamic random access memory (DRAM) device and more particularly, to a method for fabricating storage capacitors on DRAM cells with fin-shaped and vertical sidewall electrodes, and thereby providing increased capacitance.

(2) Description of the Prior Art

Dynamic random access memory (DRAM) circuits are used extensively in the electronics industry for storing information as binary data. The DRAM circuit formed on chips diced from semiconductor substrates consists of an array of memory cells, and peripheral circuits for randomly accessing the memory cells. The individual memory cells, comprising of a single field effect transistor (FET) and a charge storage capacitor, have been significantly reduced in size, and the array of cells on the chip have dramatically increased. For example, by the year 1998 the number of memory cells on the DRAM chip are expected to increase four fold reaching an expected 256 million cells (256 Megabits chip). The dramatic increase in the number of memory cells is a result of improved semiconductor processing technologies, such as high resolution photolithography and directional plasma etch to name a few. The device minimum feature size on the chip are now less than a half micrometer (um) and are expected to be a quarter micrometer by the year 1998.

In order to maintain a reasonable DRAM chip size while increasing the number of storage cells on the chip it is necessary to decrease the horizontal dimensions of the memory cell and the capacitor that is formed in each cell. However, the accompanying reduction in capacitance makes it difficult to maintain an acceptable signal-to-noise level and each capacitor also requires more frequent refresh cycles to retain the charge that dissipates with time. Therefore, there is a strong need in the industry to maintain or increase the capacitance in each memory cell while reducing the area that the capacitor occupies on the DRAM cell.

A trench storage capacitor formed in the substrate adjacent to the FET, and a stacked storage capacitor formed over the FET on the substrate are two common approaches for making the memory cell storage capacitors. Of the two approaches the stacked capacitor has received considerable interest, in recent years, because of the variety of ways that the capacitor electrodes can be formed in the vertical (third) dimension over the FET and within the cell area to increase the capacitance while maintaining or reducing the cell area.

A number of methods have been reported for making stacked capacitors with increased capacitance. For example, H. T. Lui et al in U.S. Pat. No. 5,396,456 H. describe a method for making a stacked capacitor having a tub shape capacitor for increasing the capacitance. In U.S. Pat. No. 4,742,018 by S. Kimura et al, a capacitor is described having a second conducting extension formed on the bottom electrode of the capacitor to increase the capacitance. Another approach is described in U.S. Pat. No. 5,053,351 by P. Fazan et al, in which the bottom electrode is E-shaped to increase capacitance and is called a E-cell capacitor DRAM cell. Still another DRAM cell is described in U.S. Pat. No. 5,021,357 by M. Taguchi et al, in which a multilayer of dissimilar materials are selectively etched to form the capacitor bottom electrode with increased surface area.

Although the above methods provide a means for increasing the capacitance on stacked capacitors for DRAM, there is still a need in the semiconductor industry to provide methods that further increase capacitance while providing a cost effective manufacturing process.

SUMMARY OF THE INVENTION

It is the principal object of this invention to provide a dynamic random access memory circuit having a new stacked capacitor structure with increased capacitance and a method for making the capacitor structure.

It is another object of this invention to provide a method for make this stacked capacitor structure by forming a horizontal fin-shaped bottom electrode with vertical extensions that further increase the capacitance of the stacked capacitor.

It is still another object of the invention to fabricate these stacked capacitors with a simple process that is manufacturing cost effective.

The process for forming the array of memory cells having these fin-shaped electrodes with vertical extensions begins by providing a semiconductor substrate, composed of for example single crystal silicon. Field oxide (FOX) regions are formed on the principle surface of the substrate surrounding and electrically isolating an array of active device regions wherein field effect transistors (FETs) are fabricated. The FETs are built by first forming a thin gate oxide on the substrate surface in the active device regions. A first polysilicon layer is deposited on the gate oxide and elsewhere on the field oxide and made electrically conducting by doping with an $N^+$ dopant, such as arsenic or phosphorus. The deposition is preferably done by low pressure chemical vapor deposition (LPCVD). This first polysilicon layer is then patterned to form the gate electrodes for the field effect transistors (FETs) in the device regions and conducting polysilicon patterns (word lines) elsewhere on the field oxide areas. As is commonly practiced in the semiconductor industry, lightly doped drain (LDD) areas are formed next in the device areas adjacent to the gate electrodes to minimize the short channel effects. Typically, for N-channel FETs the LDDs are formed by ion implantation of an N-type impurity, such as arsenic (As) or phosphorus (P). Insulating sidewall spacers are then formed on the sidewall of the polysilicon gate electrode by depositing an insulating layer and anisotropically etching back the layer. The FET is then completed by forming heavily doped source/drain contact areas adjacent to the sidewall spacers also by ion implantation to provide low resistance ohmic contact regions.

The array of stacked capacitors are now formed by the following series of steps. A multilayered structure is formed by depositing in the following order, a first insulating layer composed of silicon nitride ($Si_3N_4$), a second insulating layer composed of silicon oxide ($SiO_2$), a $N^+$ doped second polysilicon layer, and a third insulating layer also composed of $SiO_2$. Contact openings are etched in the multilayer to one of the two source/drain areas of each FET, providing for the node contacts of the capacitor bottom electrodes. A photoresist mask is patterned having portions over each of the planned capacitor areas that also include one of the node contact openings. Anisotropic etching is used to pattern the third insulating layer and the second polysilicon layer forming portions over the second insulating layer in the planned capacitor areas. The patterned layers having essentially vertical sidewalls. The patterned second polysilicon will later form a lower fin structure for the capacitor bottom electrode. The photoresist mask is then removed by conventional means, such as ashing in an oxygen plasma. An $N^+$ doped third polysilicon layer is conformally deposited, for example, by low pressure chemical vapor deposition (LPCVD), over the patterned third insulating layer and elsewhere on the underlying second insulating layer. The third polysilicon layer also deposits in the contact openings and forms the electrical contact to the source/drain areas and electrical contact to the second polysilicon layer exposed in the sidewall of the contact openings. As will be seen later, this third polysilicon layer is patterned to form the upper fin structure of the bottom electrode and also forms a vertical extension on the perimeter of the lower fin structure of the bottom electrode and is one of the important features of the invention because it further increases the capacitance of the stacked capacitor.

Now a second important feature of the invention is the way in which the third polysilicon layer is patterned to form the array of bottom electrodes each having two horizontal fin-shaped structures (lower and upper fins) and at the same time forming the vertical extension on the lower fin structure. These bottom electrodes are formed by spin coating a photoresist layer on the third polysilicon layer and patterning by lithographic means so as to leave portions of the photoresist on the third polysilicon layer aligned over the patterned third insulating layer, but smaller in area so as to leave exposed portions of the third polysilicon layer on the top surface of the patterned third insulating layer around and at the perimeter of the patterned third insulating layer. The third polysilicon layer is then anisotropically plasma etched to form the upper fin structure that also makes electrical contact to the source/drain contact (capacitor node) and the sidewall of the second polysilicon layer in the contact opening. The anisotropic plasma etching also exposes the surface of the third insulating ($SiO_2$) at the perimeter, and concurrently, the anisotropic etch also forms the sidewall spacers on the vertical sidewall of the patterned third insulating layer forming the vertical extensions on the lower fin structures. Furthermore, the same etching also completely removes the third polysilicon layer on the second insulating layer ($Si_3N_4$) which results in forming the array of electrically isolated bottom electrodes.

The remaining third insulating layer is removed in an isotropic etch, such as a solution of hydrofluoric acid/water ($HF/H_2O$), resulting in an array of free standing capacitor bottom electrodes. The array of DRAM cells are completed by forming a capacitor dielectric layer on the surface of the bottom electrodes and then depositing an $N^+$ doped fourth polysilicon layer which is patterned to form the top electrodes of the stacked capacitors.

Finally, a planarizing insulating layer, such as a borophosphosilicate glass (BPSG) is deposited and the bit line contact openings are etched in the BPSG, the capacitor dielectric layer and the first insulating layer to the second source/drain areas of each FET, and then the bit line metallurgy is formed to complete the DRAM circuit up to the first metal interconnecting level.

BRIEF DESCRIPTION OF THE DRAWINGS

The objects and advantages of this invention are best understood by the preferred embodiment with reference to the attached drawings which are now briefly described.

DESCRIPTION OF THE PREFERRED EMBODIMENTS

Now in keeping with the objects of this invention, the method for forming an array of DRAM cells having storage capacitor with increased capacitance is described in detail. The sequence of fabrication steps are shown in FIGS. 2 through 11.

It should also be well understood by one skilled in the art that by including additional process steps, not described in this embodiment, other types of devices can also be included on the DRAM chip. For example, P channel FETs can also be formed in and on N-Wells that are provided in the P substrate and by interconnecting the P-channel and N-channel FETs, CMOS circuits can be formed therefrom. It should be further understood that concurrently and with the same mask set that peripheral circuits are formed on the same DRAM chip to randomly access the memory cells and to read out and write in information by sensing and storing charge on the capacitors, respectively.

Figure 1:
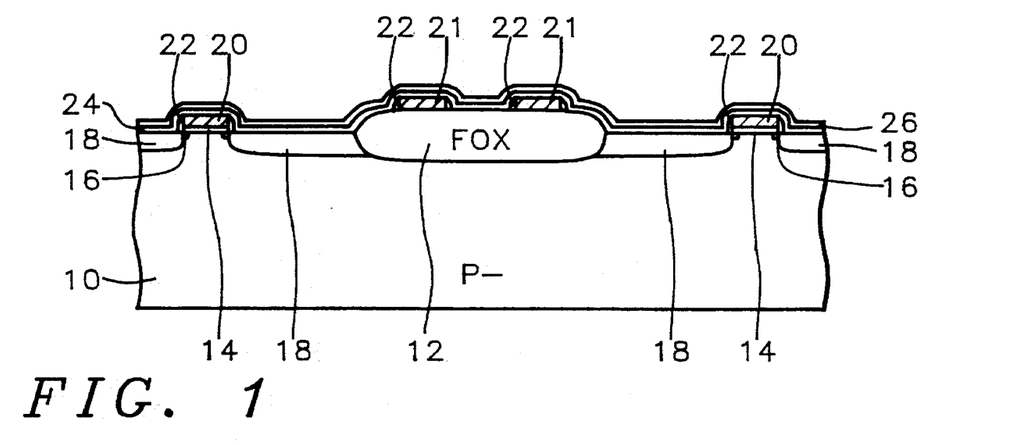
FIGS. 1 through 11 shows a schematic cross sectional views of a portion of a DRAM device formed by the method of this invention. The views are for a portion of the DRAM device having two adjacent memory cells having stacked capacitors with bottom electrodes formed of two fins-shaped parts with the lower fin having a vertical extension.

Referring to FIG. 1, a schematic cross-sectional view is shown of a portion for partially completed DRAM device with two adjacent memory cells formed in and on the surface of a substrate 10. The preferred substrate is composed of a P-type single crystal silicon having a <100> crystallographic orientation. A relatively thick Field OXide (FOX) 12 is formed around and electrically isolate device areas. However, only a portion of the field oxide 12 is shown separating two adjacent device areas in which the memory cells are built. One conventional method of forming the field oxide 12 is the LOCOS (local oxidation of silicon) method in which a patterned thin silicon oxide (pad oxide) (not shown) and a thicker silicon nitride layer (also not shown) are formed over the device areas as a barrier to oxidation. The silicon substrate is then subjected to an oxidizing ambient to form the field oxide 12. Typically the field oxide 12 is between about 3000 to 6000 Angstroms thick.

Figure 2:
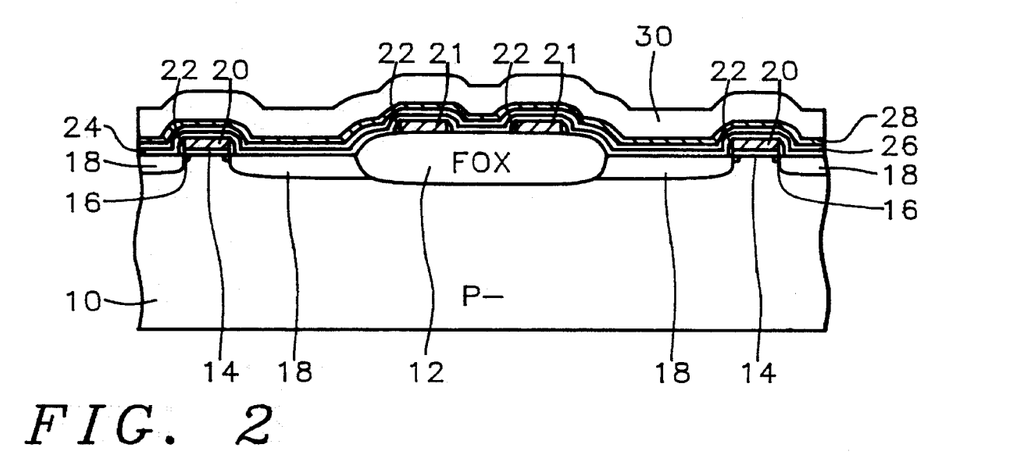

After removing the silicon nitride layer and the pad oxide layer in a conventional wet etch, the FET devices are formed in the device areas. The most commonly used FET device for the dynamic random access memory cells is the N-channel field effect transistor (FET) having an $N^+$ doped polysilicon gate electrode. The FET device is formed by first thermally oxidizing the device area to form a thin gate oxide 14. The preferred gate oxide thickness is between about 75 to 150 Angstroms. After forming the gate oxide 14, a first polysilicon layer 20 is deposited and patterned by conventional photolithographic techniques and anisotropic plasma etching to form an array of polysilicon strips that form FET gate electrodes 20 on the gate oxide 14 in the device areas and interconnecting word lines 21 on the field oxide areas 12. The cross section through four polysilicon strips are shown in FIG. 2, two of which are cross sections through two gate electrodes 20, and two of which are cross sections through portions that formed interconnecting word lines 21, are shown in FIG. 1. The word lines electrically connect the FET gate electrodes, formed from the same strip to the appropriate peripheral circuits on the DRAM chip. Typically, the first polysilicon layer 20 is deposited by low pressure chemical vapor deposition (LPCVD) using the decomposition of a reactant gas such as silane ($SiH_4$). The first polysilicon layer is then doped by ion implantation using for example arsenic ($As^{75}$) or alternatively, the polysilicon layer 20 can be in situ doped during the polysilicon deposition. The dopant concentration in the polysilicon after implantation is typically between about 2.0 E 19 to 5.0 E 20 atoms/cm$^3$.

Lightly doped source/drain areas 16 for the N-channel FETs are now formed adjacent to the gate electrodes 20, as shown in FIG. 1. The lightly doped source/drain areas are usually formed by ion implantation of an N-type dopant, such as arsenic ($As^{75}$), which are made self-aligning to the gate electrodes by the masking effect of the gate electrodes. A photoresist block mask is also commonly used to prevent implanting in other areas on the substrate where N-type implantation is not desired, such as in P-channel FET areas that are used in the peripheral areas on the chip for CMOS circuits. A typical implantation dose for the source/drain areas is between about 1.0 E 15 to 8.0 E 15 atoms/cm$^2$ and the ion implantation energy is between about 40 to 80 KeV. Insulating sidewall spacers 22 are formed next on the sidewalls of the gate electrodes 20 by depositing an insulating layer, such as silicon oxide, and anisotropically etching back by plasma etching to the top surface of the gate electrodes. A second ion implantation, using for example arsenic ($As^{75}$) or phosphorus ($p^{31}$), heavily $N^+$ doped source/drain contacts 18 are formed adjacent to the sidewall spacers 22. Typically the dose is between about 1.0 E 15 to 1.0 E 16 ions/cm$^2$ and the implant energy is between about 50 to 120 KeV. After completing the formation of the FETs, the stacked capacitors are formed to one of the two source/drain contact areas of each FET.

Referring still to FIG. 1, a first insulating layer 24 is deposited on the device areas and on the field oxide areas. For the method of this invention the preferred layer 24 is composed of silicon nitride ($Si_3N_4$) and is deposited by low pressure chemical vapor deposition (LPCVD) using for example a reactant gas containing dichlorosilane ($SiCl_2H_2$) and ammonia ($NH_3$). The preferred thickness of nitride layer 24 is between about 1000 to 3000 Angstroms. A relatively thin second insulating layer 26, preferably composed of silicon oxide ($SiO_2$) is deposited on the silicon nitride layer 24, as shown in FIG. 1. For example, layer 26 can also be deposited by LPCVD by the decomposition of tetra-ethosiloxane (TEOS) in a temperature range of between about 650° to 800° C. The preferred thickness of the oxide layer 26 is between about 1000 to 2000 Angstroms.

Referring now to FIG. 2, a conformal second polysilicon layer 28 is deposited on the second insulating layer 26. The polysilicon layer 28 is preferably deposited by a low pressure chemical vapor deposition (LPCVD), using for example the decomposition of silane ($SiH_4$). The polysilicon layer 28 is then doped by ion implantation, using for example, phosphorus ($p^{31}$) or arsenic ($As^{75}$) ion. Alternatively, the polysilicon layer can be in situ doped during the polysilicon deposition by adding, for example, phosphine ($PH_3$) or arsine ($ASH_3$) to the silane ($SiH_4$) during the deposition. The preferred dopant concentration in the polysilicon layer 28 after implantation or in situ doping is typically between about 5.0 E 19 to 6.0 E 20 atoms/cm$^3$. The preferred thickness of the second polysilicon layer 28 is between about 1000 to 2000 Angstroms, and is heavily doped to provide a low resistance ohmic contact to a third polysilicon layer that is later formed. Portions of this second polysilicon 28 are later used to form the lower fin-shaped structures for the bottom electrodes of the stacked capacitors.

After depositing the second polysilicon layer 28 a relatively thick third insulating layer 30 is deposited, as is also depicted in FIG. 2. Layer 30 serves as an expendable layer that is later removed after forming an upper fin-shaped structure for the capacitor bottom electrodes. The third insulating layer 30 is preferably composed of silicon oxide ($SiO_2$) and can be deposited by several methods. For example, oxide layer 30 can be deposited by atmospheric pressure CVD (APCVD), LPCVD or plasma enhanced CVD (PECVD). However, the preferred deposition method is by APCVD using a reactant gas mixture of silane ($SiH_4$) and oxygen ($O_2$). As will become clear later, the thickness of the oxide layer 30 determines the height of the vertical extensions on the lower fin-shape portion of the bottom electrode, but is preferably between about 2000 to 4000 Angstroms thick.

Figure 3:
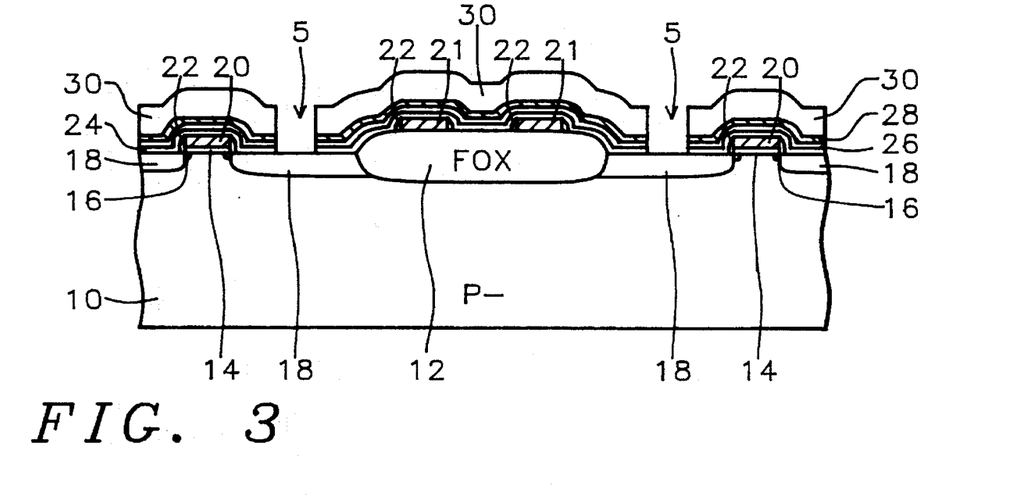

Now referring to FIG. 3, using conventional photolithographic techniques and anisotropic plasma etching, contact openings 5 are formed in the third, second and first insulating layer to one of the two source/drain contacts 18 of each FET to provide the node contact of the stacked capacitors. For example, the etching can be performed in a plasma etcher model number TEL-5000 built by the TEL Corporation located in Tokyo, Japan. The etching is carried out in a gas mixture of between about 25 to 35 sccm of trifluoromethane ($CHF_3$), 25 to 35 sccm of carbon tetrafluoride ($CF_4$), and about 225 to 275 sccm of argon (Ar). The gas pressure during etching is between about 210 to 255 mTorr, and the rf power is between about 750 to 850 Watts.

Figure 4:
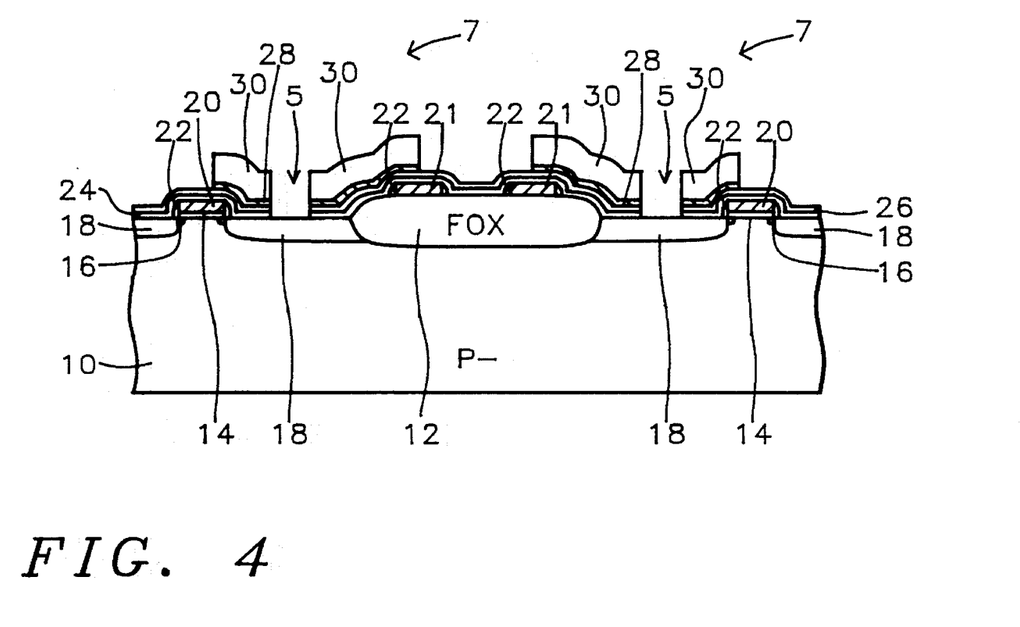

Referring now to FIG. 4, the third insulating layer 30 and the second polysilicon layer 28 are patterned using conventional photolithographic techniques and anisotropic plasma etching. The patterned layers 30 and 28 are formed over the designated or planned areas where the bottom electrodes are to be formed, and are shown in FIG. 4 after the photoresist is removed. The layers 30 and 28 are etched to the surface of the second insulating layer 26 elsewhere on the substrate. Each patterned portions of layers 30 and 28 also include within them a node contact opening 5. Two patterned portions 7 of layers 30 and 28 are shown in FIG. 4 for two adjacent memory cells. Typically, the silicon oxide layer 30 is plasma etched in a carbon tetrafluoride gas and the polysilicon layer 28 is then plasma etched in a gas mixture containing chlorine ($Cl_2$) so as to provide a good selective etch to the underlying oxide layer 26, and provide essentially vertical sidewalls on the patterned layers.

Figure 5:
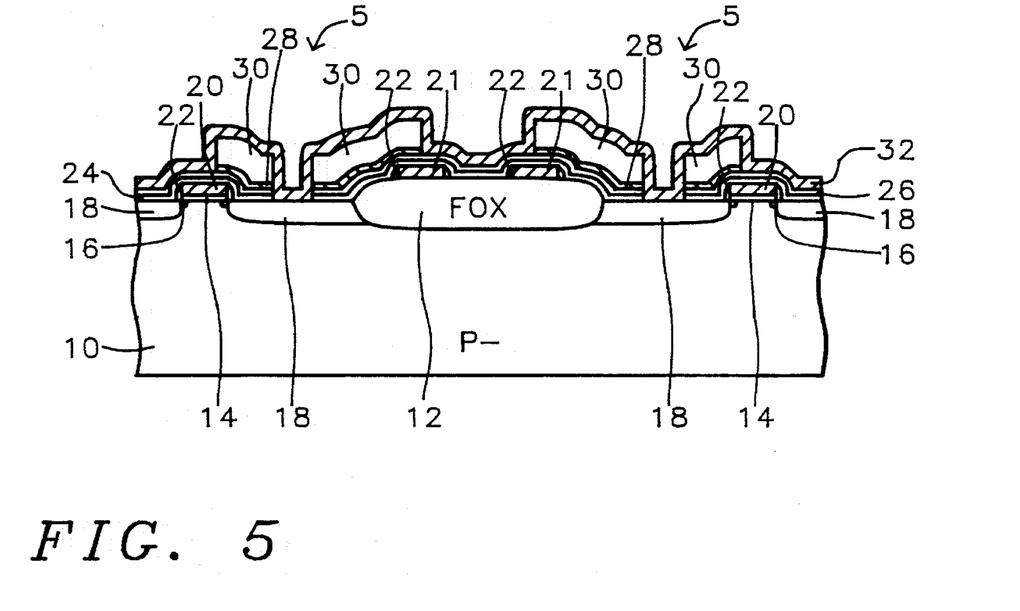

A third polysilicon layer 32 is now deposited, conformally coating the patterned layers 30 and 28 and also contacting the source/drain areas in the opening 5. The conformal polysilicon layer 32 also contacts the exposed sidewall portion of the second polysilicon layer 28, as shown in FIG. 5. Portion of layer 32 will eventually form the upper fin-shaped portion of the capacitor bottom electrode, and portions of the vertical extensions on the lower fin structure. The layer 32 is preferably deposited using low pressure chemical vapor deposition and is also made electrically conductive by heavily doping with an $N^+$ type dopant, such as phosphorus. The doping being achieved by ion implantation or in situ doping during the polysilicon deposition, as previously described. The preferred dopant concentration in layer 32 after ion implantation or in situ doping is between about 5.0 E 19 to 6.0 E 20 atoms/cm$^3$, and the preferred thickness of layer 32 is between about 1000 to 3000 Angstroms.

Figure 6:
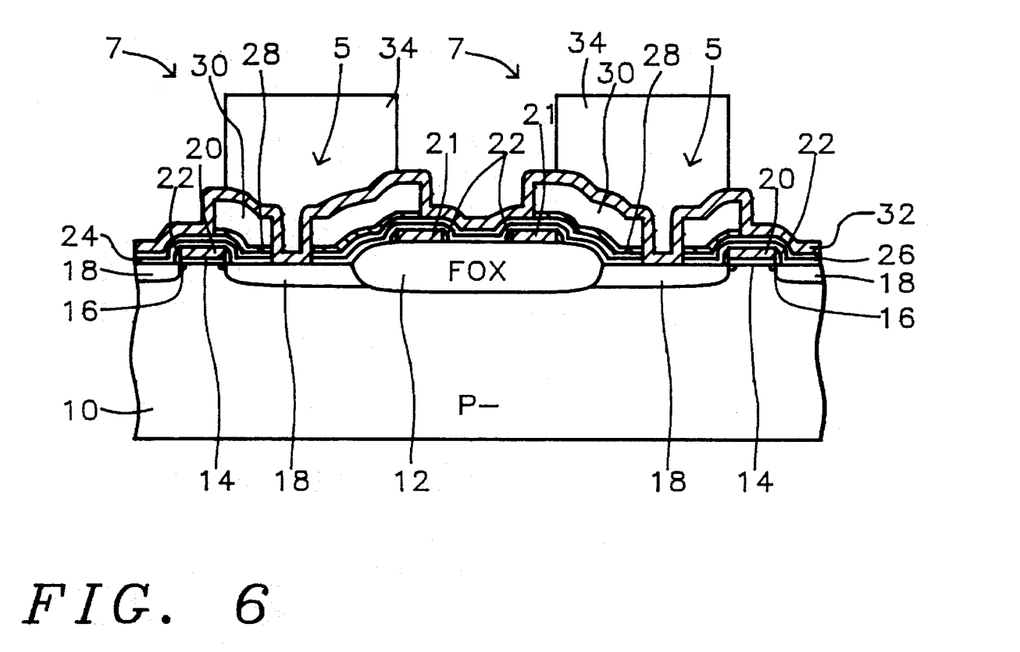

Referring now to FIG. 6, an important feature of the invention is the way in which a photoresist mask 34 is used to pattern the third polysilicon layer 32 so as to provide the upper fin-shaped portion of the capacitor bottom electrode while concurrently forming the vertical extension on the lower fin-shaped portion of the electrode, and also at the same time removing the polysilicon layer 32 between and around each capacitor area to form an array of bottom electrodes that are electrically isolated from each other. To achieve this result the photoresist 34 is patterned, as shown in FIG. 6. The photoresist is patterned leaving portions on the third polysilicon layer 32 aligned over the patterned third insulating layer 30, but smaller in area so that portion of the polysilicon layer 32 are exposed on the top surface of the insulating layer 30 at the perimeter of the planned capacitor area 7.

Figure 7:
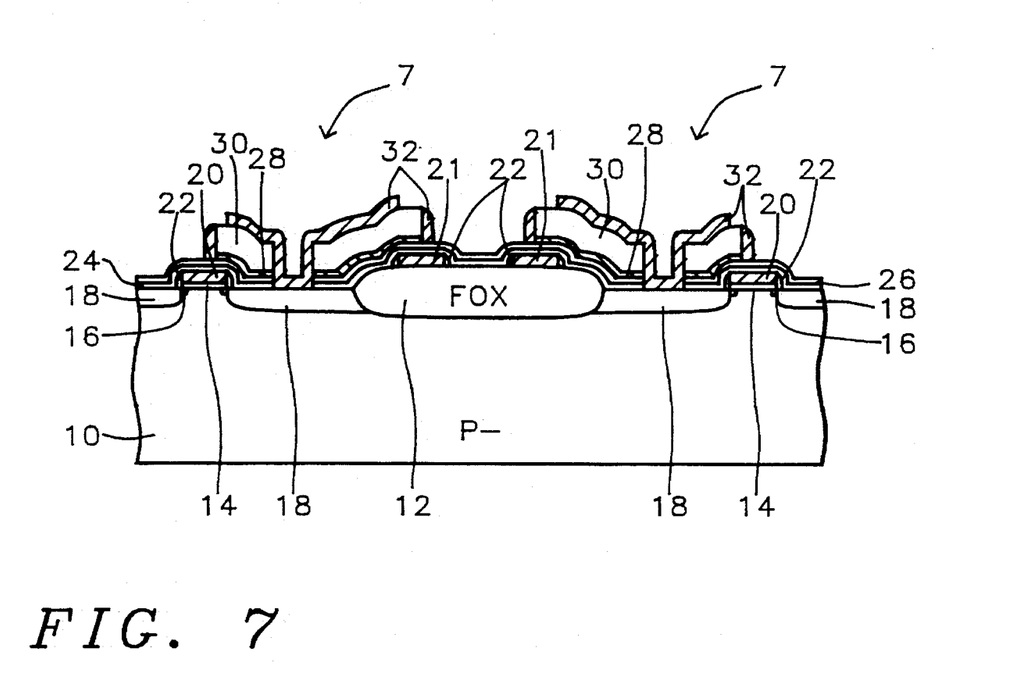

Using the patterned photoresist 34 as an etch mask the third polysilicon layer 32 is etched anisotropically and selectively to the surface of the silicon oxide layers 30 and 26. As shown in FIG. 7, the anisotropic etching forms a bottom electrode having a lower fin-shaped portion formed from polysilicon layer 28, and an upper fin-shaped portion and a vertical extension on the lower fin layer 32. The layer 32 is also etched to the oxide layer 24 around and between the capacitor areas to electrically isolate the array of capacitors. The etching is performed in a plasma etcher. For example a model P-5000 plasma etcher built by the Applied Materials Corporation of California can be used. The polysilicon layer is preferred etched at a pressure of between about 75 to 85 mTorr using a flow rate of between about 65 to 75 standard cubic centimeters per minute (sccm) and in a rf power range of between about 180 to 220 Watts. After the etching is completed the photoresist mask is removed using conventional means, such as in a plasma asher using oxygen or in a ozone stripper.

Figure 8:
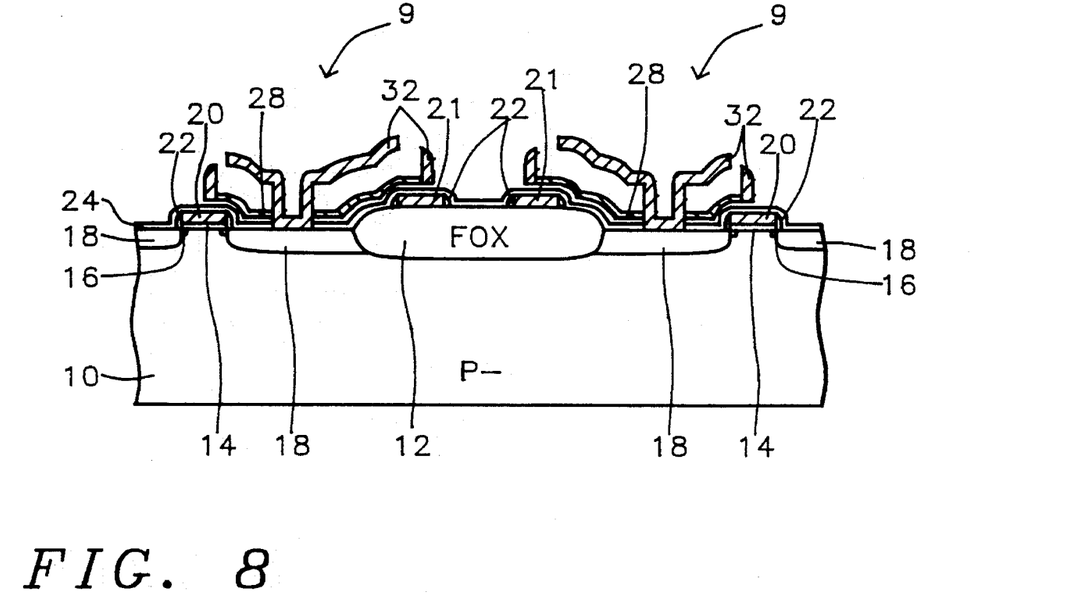

Using an isotropic etch (wet etch), the remaining portions of the silicon oxide layer 30 between the upper and lower fin-shaped portions of the capacitor bottom electrodes formed from polysilicon layers 32 and 34, and the silicon oxide layer 26 under the lower fin-shaped are completely removed forming a free standing bottom electrode structures 9, as shown in FIG. 8. For example, the silicon oxide can be etched in a dilute solution of hydrofluoric acid (HF) and water or alternatively, a buffered oxide etch (BOE) can be used containing a 6:1 (by volume) of $NH_4F:HF$ (40%:49%). The silicon nitride 24 under the oxide layer 26 is used as an etch stop layer to protect underlying silicon devices during the etch.

Figure 9:
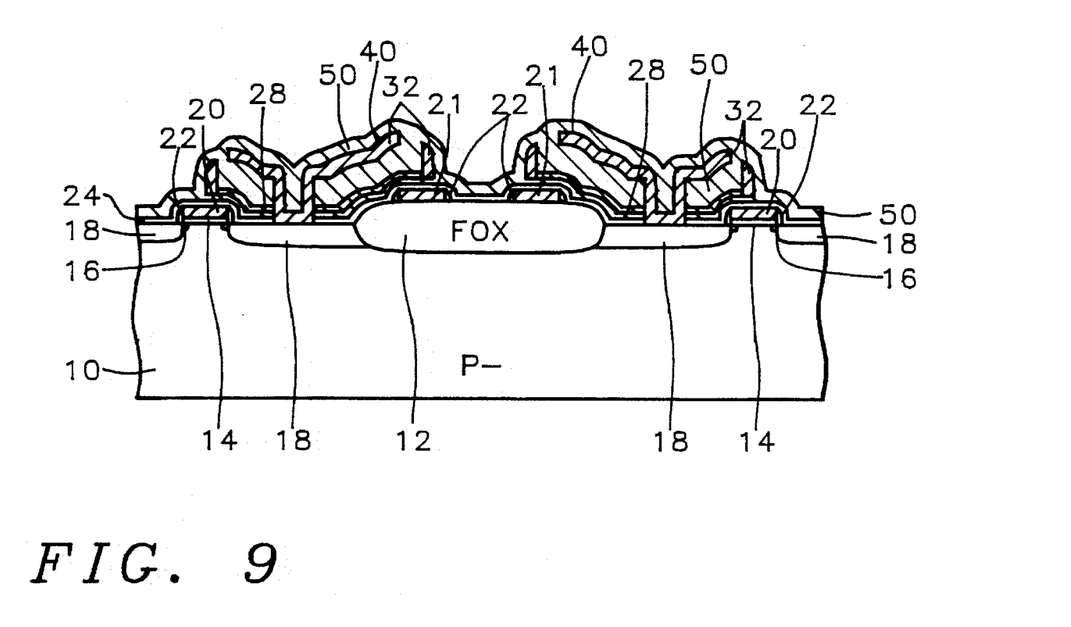

Referring to FIG. 9, the array of stacked storage capacitors are completed by forming a capacitor dielectric layer 40 having a high dielectric constant on the surface of the bottom electrodes and then depositing a fourth polysilicon layer 50 to form the top capacitor electrodes and complete the storage capacitors for the DRAM cells of this invention. The dielectric layer 40 is indicate in FIG. 9 by 40 pointing to the surface of layers 28 and 32, and not depicted as a separate layer.

Typically, the capacitor dielectric layer 40 is composed of a material having a high dielectric constant and pin hole free, and is preferably between about 40 to 100 Angstroms in thickness. One type of high dielectric layer material is preferably composed of silicon oxide-silicon nitride-silicon oxide (ONO) layer. Alternatively, other high dielectric constant materials can be used. For example, tantalum pentoxide is another high dielectric material that can be used for the capacitor dielectric.

Figure 10:
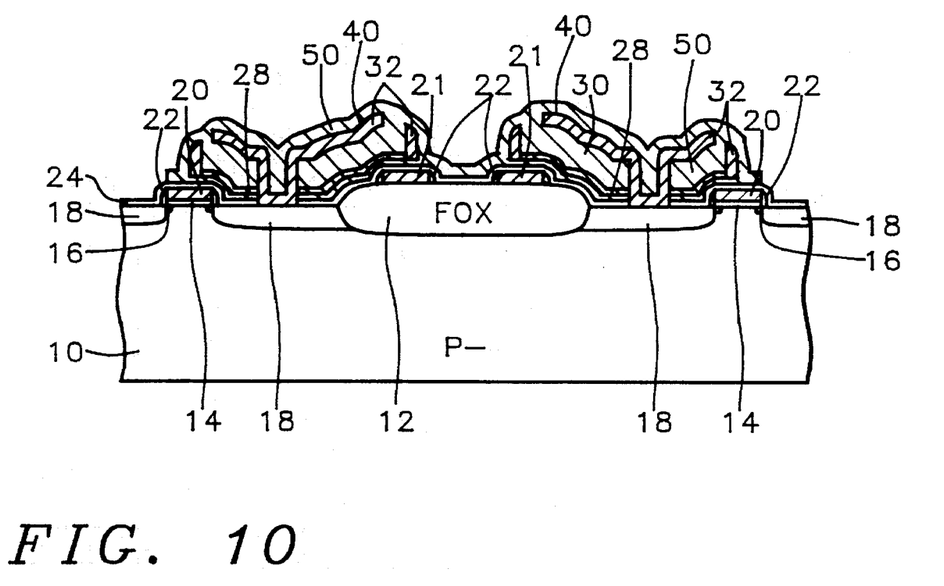
Figure 11:
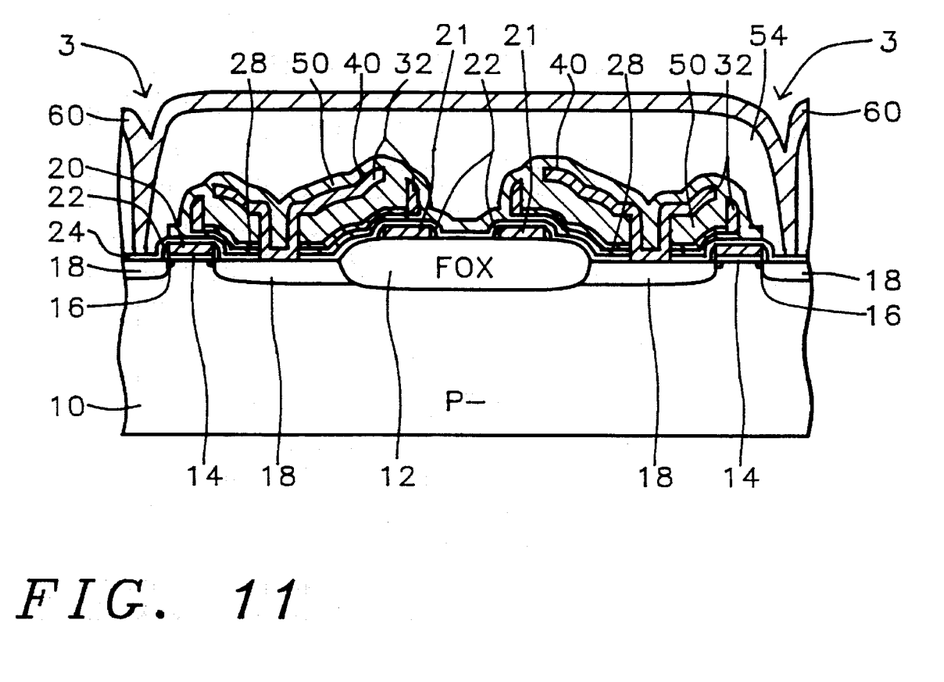

Also shown in FIG. 10, a conformal fourth polysilicon layer 50 is deposited over the capacitor dielectric layer 40, which also filling the space between the fin-shaped portions of the electrodes and under the lower fin (layer 28) and then layer 50 is patterned by conventional photolithographic techniques and anisotropic etching to form the top capacitor electrode 50, as shown in FIG. 11. In FIG. 10 is shown a top electrode shared by the two capacitors of the adjacent memory cells. The thickness of the polysilicon layer 50 is between about 2000 to 4000 Angstroms. The deposition is achieved in a LPCVD reactor using, for example, the decomposition of silane ($SiH_4$).

The formation of the remaining DRAM circuit is conventional, and is shown in FIG. 11 completed to the first level metal interconnect. A fourth insulating layer 54 is deposited typically composed of borophosphosilicate glass (BPSG), preferably deposited by atmospheric pressure chemical vapor deposition (APCVD) and having a thickness of between about 4000 to 8000 Angstroms. The BPSG is then annealed to essentially planarize the BPSG surface. Photoresist masking and plasma etching are used to form the bit line contact openings 3, as shown in FIG. 12, to the second source/drain contact of each FET in the array of memory cells. The contact is etched through the BPSG layer and the first insulating layer 24 (silicon nitride) using an appropriate anisotropic plasma etching. A fifth polysilicon layer 60 is deposited, doped N-type, and then etched to form the bit line metallurgy and the bit line contacts. Alternatively, a silicide layer can be formed on the fifth polysilicon layer to increase its electrical conductivity. The preferred method is to deposit a thin metal layer, such as tungsten, followed by a low temperature anneal to form a tungsten silicide (WSi). The polysilicon/silicide bit line wiring is then formed by conventional plasma etching using a photoresist mask to complete the DRAM circuit up to the first level interconnect.

While the invention has been particularly shown and described with reference to the preferred embodiments thereof, it should be understood by those skilled in the art that various changes in form and details may be made without departing from the spirit and scope of the invention.

What is claimed is:

1. A method for fabricating an array of dynamic random access memory cells having stacked capacitors with increased capacitance, comprising the steps of:

forming a field oxide on a semiconductor substrate surrounding and electrically isolating device areas for field effect transistors;

forming a gate oxide layer on said device areas;

depositing a first polysilicon layer on said device, and field oxide areas;

patterning said first polysilicon layer forming gate electrodes on said device areas for said field effect transistors and also electrically conducting portions on said field oxide areas for word lines;

forming source/drain areas adjacent to said gate electrodes, and thereby forming said field effect transistors, and furthermore forming said stacked capacitors by;

depositing a first insulating layer composed of silicon nitride on said device areas and said field oxide areas, depositing a second insulating layer composed of silicon oxide on said first insulating layer, depositing a doped second polysilicon layer on said second insulating layer, depositing a third insulating layer on said doped second polysilicon layer, and forming contact openings in said third, second and first insulating and in said second polysilicon layer to said source/drain areas and thereby forming contact openings for the bottom electrodes of said stacked capacitors, patterning said third insulating layer and said second polysilicon layer leaving portions with vertical sidewalls over said planned stacked capacitor areas, and having said contact openings therein;

depositing a blanket conformal doped third polysilicon layer over said patterned third insulating layer, in said contact openings, and elsewhere on said second insulating layer;

patterning said third polysilicon layer by photoresist masking and anisotropic etching, leaving portions aligned over and smaller in width than said patterned third insulating layer, and thereby exposing portions of said patterned third insulating layer on the perimeter, and further said anisotropic etching concurrently forming polysilicon sidewall spacers on said vertical sidewalls of said third insulating layer and contacting said second polysilicon layer, and also concurrently removing by anisotropic etching said third polysilicon layer elsewhere on said substrate, thereby forming an array of electrically isolated bottom electrodes for said stacked capacitors;

removing completely by selective and isotropic etching said third insulating layer and said second insulating layer, and thereby forming free standing said array of bottom electrodes;

forming on the surface of said polysilicon bottom electrodes a capacitor dielectric layer;

depositing a doped conformal fourth polysilicon layer;

patterning said fourth polysilicon layer and forming capacitor top electrodes, and completing said array of dynamic random access memory cells.

2. The method of claim 1, wherein the thickness of said first polysilicon layer is between about 1000 to 4000 Angstroms.

3. The method of claim 1, wherein the thickness of said first insulating layer is between about 1000 to 3000 Angstroms.

4. The method of claim 1, wherein the thickness of said second insulating layer is between about 1000 to 2000 Angstroms.

5. The method of claim 1, wherein the thickness of said second polysilicon layer is between about 1000 to 2000 Angstroms.

6. The method of claim 1, wherein said third insulating layer is composed of silicon and is between about 2000 to 4000 Angstroms thick.

7. The method of claim 1, wherein the thickness of said conformal third polysilicon layer is between about 1000 to 3000 Angstroms.

8. The method of claim 1, wherein said isotropic etch of said third insulating is performed in a solution containing hydrofluoric acid (HF) and water ($H_2O$).

9. The method of claim 1, wherein said capacitor dielectric layer is silicon oxide/silicon nitride/silicon oxide having a thickness of between about 40 to 100 Angstroms.

10. The method of claim 1, wherein the thickness of said fourth polysilicon layer is between about 1000 to 4000 Angstroms.

11. The method of claim 1, wherein said first, second, third and fourth polysilicon layers are doped N-type having a concentration between about 5.0 E 19 to 6.0 E 20 atoms/$cm^3$.

12. A method for fabricating a dynamic random access memory (DRAM) circuit having an array of memory cells with stacked capacitors, comprising the steps of:

providing a semiconductor substrate having DRAM chips with peripheral circuits for randomly accessing, reading and writing information on said memory cells, and furthermore said memory cells fabricated by;

forming a field oxide on a semiconductor substrate surrounding and electrically isolating device areas for field effect transistors;

forming a gate oxide layer on said device areas;

depositing a first polysilicon layer on said device, and field oxide areas;

patterning said first polysilicon layer forming gate electrodes on said device areas for said field effect transistors and electrically conducting portions on said field oxide areas for word lines;

forming source/drain areas adjacent to said gate electrodes, and thereby forming said field effect transistors; and furthermore forming said stacked capacitors by;

depositing a first insulating layer composed of silicon nitride on said device areas and said field oxide areas, depositing a second insulating layer composed of silicon oxide on said first insulating layer, depositing a doped second polysilicon layer on said second insulating layer, depositing a third insulating layer on said doped second polysilicon layer, and forming contact openings in said third, second and first insulating and in said second polysilicon layer to said source/drain areas and thereby forming contact openings for the bottom electrodes of said stacked capacitors, patterning said third insulating layer and said second polysilicon layer leaving portions with vertical sidewalls over said planned stacked capacitor areas, and having said contact openings therein;

depositing a blanket conformal doped third polysilicon layer over said patterned third insulating layer, in said contact openings, and elsewhere on said second insulating layer;

patterning said third polysilicon layer by photoresist masking and anisotropic etching, leaving portions aligned over and smaller in width than said patterned third insulating layer, and thereby exposing portions of said patterned third insulating layer on the perimeter, and further said anisotropic etching concurrently forming polysilicon sidewall spacers on said vertical sidewalls of said third insulating layer and contacting said second polysilicon layer, and also concurrently removing by anisotropic etching said third polysilicon layer elsewhere on said substrate, thereby forming an array of electrically isolated bottom electrodes for said stacked capacitors;

removing completely by selective and isotropic etching said third insulating layer and said second insulating layer, and thereby forming free standing said array of bottom electrodes;

forming on the surface of said polysilicon bottom electrodes a capacitor dielectric layer;

depositing a doped conformal fourth polysilicon layer;

patterning said fourth polysilicon layer and forming capacitor top electrodes, and completing said dynamic random access memory circuit.

13. The method of claim 12, wherein the thickness of said first polysilicon layer is between about 1000 to 4000 Angstroms.

14. The method of claim 12, wherein the thickness of said first insulating layer is between about 1000 to 3000 Angstroms.

15. The method of claim 12, wherein the thickness of said second insulating layer is between about 1000 to 2000 Angstroms.

16. The method of claim 12, wherein the thickness of said second polysilicon layer is between about 1000 to 2000 Angstroms.

17. The method of claim 12, wherein said third insulating layer is composed of silicon and is between about 2000 to 4000 Angstroms thick.

18. The method of claim 12, wherein the thickness of said conformal third polysilicon layer is between about 1000 to 4000 Angstroms.

19. The method of claim 12, wherein said isotropic etch of said third insulating is performed in a solution containing hydrofluoric acid (HF) and water ($H_2O$).

20. The method of claim 12, wherein said capacitor dielectric layer is silicon oxide/silicon nitride/silicon oxide having a thickness of between about 40 to 100 Angstroms.

21. The method of claim 12, wherein the thickness of said fourth polysilicon layer is between about 1000 to 4000 Angstroms.

22. The method of claim 1, wherein said first, second, third and fourth polysilicon layers are doped N-type having a concentration between about 5.0 E 19 to 6.0 E 20 atoms/$cm^3$.

* * * * *